United States Patent
Chang et al.

(10) Patent No.: US 10,459,332 B2
(45) Date of Patent: Oct. 29, 2019

(54) MASK BLANK AND FABRICATION METHOD THEREOF, AND METHOD OF FABRICATING PHOTOMASK

(71) Applicant: Taiwan Semiconductor Manufacturing Co., Ltd., Hsinchu (TW)

(72) Inventors: Hao-Ming Chang, Pingtung (TW); Chih-Ming Chen, Taoyuan County (TW); Cheng-Ming Lin, Yunlin County (TW); Sheng-Chang Hsu, New Taipei (TW); Shao-Chi Wei, Hsinchu (TW); Hsao Shih, Hsinchu (TW); Li-Chih Lu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 96 days.

(21) Appl. No.: 15/470,933

(22) Filed: Mar. 28, 2017

(65) Prior Publication Data
US 2018/0284601 A1   Oct. 4, 2018

(51) Int. Cl.
*G03F 7/26* (2006.01)
*G03F 1/26* (2012.01)
*H01L 21/027* (2006.01)
*G03F 1/38* (2012.01)

(52) U.S. Cl.
CPC ............. *G03F 1/26* (2013.01); *G03F 1/38* (2013.01); *H01L 21/0274* (2013.01)

(58) Field of Classification Search
CPC ..................................... G03F 1/26; G03F 1/50
See application file for complete search history.

(56) References Cited

U.S. PATENT DOCUMENTS

| | | | |
|---|---|---|---|
| 6,361,911 B1 | 3/2002 | Tsai et al. | |
| 6,720,565 B2 | 4/2004 | Innes et al. | |
| 8,796,666 B1 | 8/2014 | Huang et al. | |
| 8,945,803 B2 | 2/2015 | Chen et al. | |
| 8,987,689 B2 | 3/2015 | Chen et al. | |
| 8,999,611 B2 * | 4/2015 | Tu | G03F 1/20 430/5 |
| 9,093,530 B2 | 7/2015 | Huang et al. | |

(Continued)

OTHER PUBLICATIONS

Hagaman et al., "High Quality GaN Layers on Si(111) Substrates: AlN Buffer Layer Optimisation and Insertion of a SiN Intermediate Layer", physica status solidi (a), Dec. 23, 2001, pp. 523-526.

(Continued)

*Primary Examiner* — Kathleen Duda
(74) *Attorney, Agent, or Firm* — JCIPRNET

(57) ABSTRACT

A method of fabricating a photomask includes providing a mask blank; removing a portion of the resist layer to form a patterned resist layer exposing a portion of the cooling layer; patterning the cooling layer by using the patterned resist layer as an etching mask; patterning the opaque layer; and removing the patterned resist layer and the patterned cooling layer. The mask blank includes a light-transmitting substrate and an opaque layer, a cooling layer, and a resist layer sequentially stacked thereon, wherein the cooling layer has a thermal conductivity ranging between 160 and 5000 and an effective atomic number ranging between 5 and 14.

20 Claims, 13 Drawing Sheets

(56) References Cited

U.S. PATENT DOCUMENTS

| | | |
|---|---|---|
| 9,269,537 B2 | 2/2016 | Tseng et al. |
| 9,305,799 B2 | 4/2016 | Chen et al. |
| 9,336,993 B2 | 5/2016 | Yu |
| 9,367,661 B2 | 6/2016 | Jou et al. |
| 9,529,959 B2 | 12/2016 | Wang et al. |
| 9,548,303 B2 | 1/2017 | Lee et al. |
| 2015/0177612 A1* | 6/2015 | Lin .......................... G03F 1/22 430/5 |

OTHER PUBLICATIONS

Yoshitake et al., "EBM8000 EB mask writer for product mask fabrication of 22nm half pitch generation and beyond", Proceedings of SPIE, Oct. 14, 2001, pp. 1-8.

\* cited by examiner

PM2

MASK BLANK AND FABRICATION METHOD THEREOF, AND METHOD OF FABRICATING PHOTOMASK

BACKGROUND

Photolithography is utilized in the fabrication of semiconductor devices to transfer a pattern onto a wafer. Based on various integrated circuit (IC) layouts, patterns are transferred from a photomask (or a reticles) to a surface of the wafer. As dimensions decrease and density in IC chips increases, resolution enhancement techniques, such as optical proximity correction (OPC), off-axis illumination (OAI), double dipole lithography (DDL) and phase-shift mask (PSM), are developed to improve depth of focus (DOF) and therefore to achieve a better pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
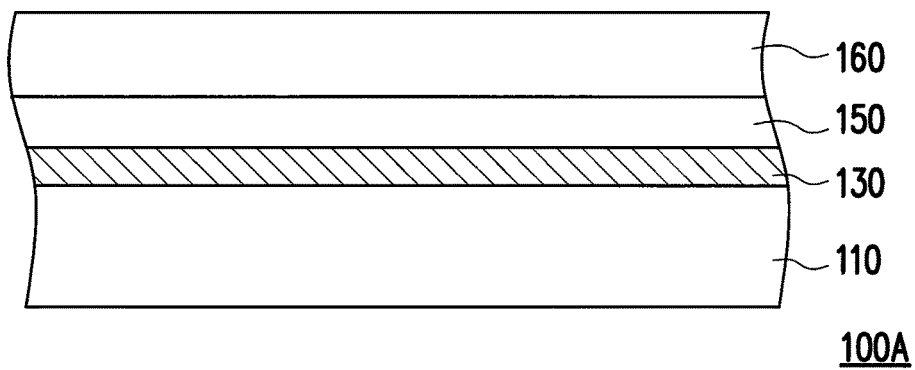
FIG. 1 is a schematic cross sectional view illustrating a mask blank according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic cross sectional view illustrating a mask blank according to some exemplary embodiments of the present disclosure. Referring to FIG. 1, in some embodiments, a mask blank 100A includes a transparent substrate 110, an opaque layer 130, a cooling layer 150, and a resist layer 160, wherein the opaque layer 130 is located between the transparent substrate 110 and the cooling layer 150, and the cooling layer 150 is located between the opaque layer 130 and the resist layer 160.

In some embodiments, the transparent substrate 110 may be formed of quartz glass, synthetic quartz glass, or fluorine-doped quartz glass. In certain embodiments, the transparent substrate 110 is a light transmitting substrate. In some embodiments, the light transmitting substrate is deemed transparent under near ultra violet (NUV) wavelengths (e.g., less than 365 nanometers (nm)). In some embodiments, the light transmitting substrate is deemed transparent under deep ultra violet (DUV) wavelengths (e.g., less than 284 nm). In some embodiments, the light transmitting substrate is deemed transparent under argon fluoride (ArF) laser (e.g., 193 nm).

Referring to FIG. 1, in some embodiments, the opaque layer 130 is disposed on the transparent substrate 110. In some embodiments, a material of the opaque layer 130, for example, includes metals metal oxides, or other suitable materials. In certain embodiments, the opaque layer 130 is made of chrome (Cr), chrome oxide, chromium oxynitride or another suitable material, that can block incident light. For example, in FIG. 1, the opaque layer 130 is directly disposed on the transparent substrate 110. However, the disclosure is not limited thereto. In some alternative embodiments, additional layer may present between the transparent substrate 110 and the opaque layer 130. In some embodiments, the formation of the opaque layer 130 includes a deposition process, such as a chemical vapor deposition (CVD), a physical vapor deposition (PVD), a sputter method, an atomic layer deposition (ALD), and the like, for example.

In some embodiments, the cooling layer 150 is disposed on the opaque layer 130, and a material of the cooling layer 150 has a thermal conductivity (k) of about 160≤k≤5000 and an effective atomic number ($Z_{eff}$) of about 5≤$Z_{eff}$≤14. In some embodiments, a thickness of the cooling layer 150 ranges from about 3 nm to about 100 nm. In certain embodiments, the material of cooling layer 150, for example, includes aluminum nitride (k~160 and $Z_{eff}$~11.55), silicon carbide (k~225 to 350 and $Z_{eff}$~12.55), boron nitride (k~600 and $Z_{eff}$~6.31), or graphene (k~200 to 5000 and $Z_{eff}$~6.00). In some embodiments, the boron nitride may be, for instance, in a hexagonal form, which is also called a h-BH. For example, in FIG. 1, the cooling layer 150 is located over the transparent substrate 110, and the opaque layer 130 is sandwiched between the transparent substrate 110 and the cooling layer 150. However, the disclosure is not limited thereto. In some alternative embodiments, additional layer may present between the opaque layer 130 and the cooling layer 150. In some embodiments, the formation of the cooling layer 150 includes a sputter method and the like, for example.

For a purpose of clarification, the methods used to calculate the effective atomic number $Z_{eff}$ and the thermal conductivity k of a material/substrate in the disclosure are provided. The effective atomic number $Z_{eff}$ of a material containing an atom or a composite material, can be calculated by a formula as follow, $Z_{eff} = \sqrt{f_1 \times (Z_1)^{2.94} + f_2 \times (Z_2)^{2.94} + ...}$, where $f_n$ is the fraction of the total number of electrons associated with each element, and $Z_n$ is the atomic number of each element. In addition, the thermal conductivity k of a material/substrate containing an atom or a composite material, can be calculated by a formula as follow, $$k \equiv -\frac{q_x''}{\left(\frac{\partial T}{\partial X}\right)}$$

(known as Fourier's law), where $q_x''$ is the heat flux density in a x direction (W·m$^{-2}$), and $\partial T/\partial X$ is the temperature gradient (K·m$^{-1}$). However, the disclosure is not specifically limited thereto, other suitable calculating methods may also be used to determine the effective atomic number $Z_{eff}$ and the thermal conductivity k of a material/substrate.

Referring to FIG. 1, in some embodiments, the resist layer 160 is disposed on the cooling layer 150, and the resist layer 160 physically contacts the cooling layer 150. In some embodiments, a material of the resist layer 160, for example, includes a positive resist material or a negative resist material, that is suitable for a subsequent patterning process such as a photolithography process with a mask or a mask-less photolithography process (for instance, an electron-beam (e-beam) writing or an ion-beam writing). In alternative embodiments, a material of the resist layer 160, for example, includes an organic compound that is deposited a substrate for biomedical chip. For example, in FIG. 1, the resist layer 160 is located over the transparent substrate 110, and the cooling layer 150 is sandwiched between the opaque layer 130 and the resist layer 160 and is completed covered by the resist layer 160. In some embodiments, the formation of the resist layer 160 includes a spin-on coating method and the like, for example.

In some embodiment, a thickness of the cooling layer 150 is greater than or equal to a thickness of a layer immediately underneath the cooling layer 150 and is less than or equal to a thickness of a layer immediately overlaying the cooling layer 150. For example, in FIG. 1, the mask blank 100A includes a laminated structure of the transparent substrate 110, the opaque layer 130, the cooling layer 150 and the resist layer 160 sequentially stacked, and thus the thickness of the cooling layer 150 is greater than or equal to a thickness of the opaque layer 130 and is less than or equal to a thickness of the resist layer 160. Based on a control of the effective atomic number $Z_{eff}$ (i.e. a range of about 5≤$Z_{eff}$≤14) and the thermal conductivity k (i.e. a range of about 160≤k≤5000) of the cooling layer 150 immediately underneath the resist layer 160, the cooling layer 150 is capable of improving a patterning profile of the resist layer 160 during lithography process.

Figure 2:
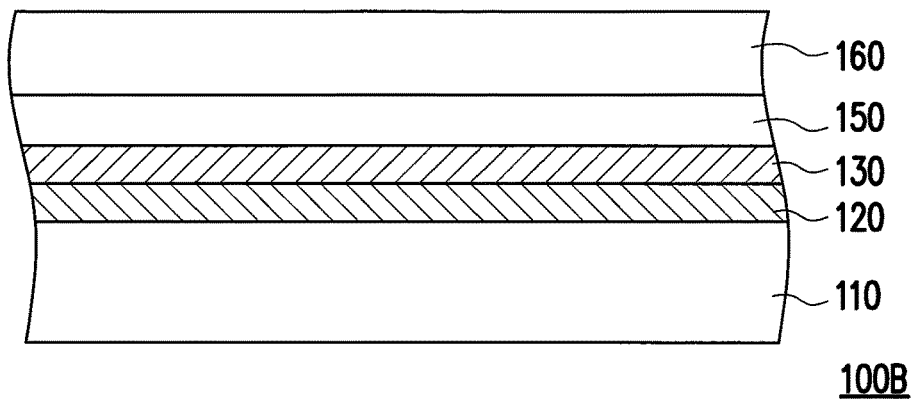
FIG. 2 is a schematic cross sectional view illustrating a mask blank according to some exemplary embodiments of the present disclosure.

FIG. 2 is a schematic cross sectional view illustrating a mask blank according to some exemplary embodiments of the present disclosure. As seen in FIG. 2, the mask blank 100B is similar to the mask blank 100A of FIG. 1. The elements similar to or substantially the same as the elements described previously will use the same reference numbers, and the descriptions of the same elements is not repeated herein. The difference is, in FIG. 2, the mask blank 100B further includes a phase shifter 120. Referring to FIG. 2, in some embodiment, the phase shift 120 is located between the transparent substrate 110 and the opaque layer 130. In some embodiments, a material of the phase shifter 120, for example, includes chromium, chromium oxide, chromium oxynitride or another suitable material; a MoSi compound; or the like. In certain embodiment, the MoSi compound may include at least one among MoSi, MoSiCON, MoSiON, MoSiCN, MoSiCO, MoSiO, MoSiC, and MoSiN. For example, in FIG. 2, the phase shifter 120 is directly disposed on the transparent substrate 110 and immediately underneath the opaque layer 130. However, the disclosure is not limited thereto. In some alternative embodiments, additional layer may present between the transparent substrate 110 and the phase shifter 120 or between the phase shifter 120 and the opaque layer 130. In some embodiments, the formation of the phase shifter 120 includes a deposition process, such as CVD, PVD, a sputter method, ALD, and the like, for example. For example, in FIG. 2, the mask blank 100B includes a laminated structure of the transparent substrate 110, the phase shifter 120, the opaque layer 130, the cooling layer 150 and the resist layer 160 sequentially stacked, and thus the thickness of the cooling layer 150 is greater than or equal to a thickness of the opaque layer 130 and is less than or equal to a thickness of the resist layer 160.

Figure 3:
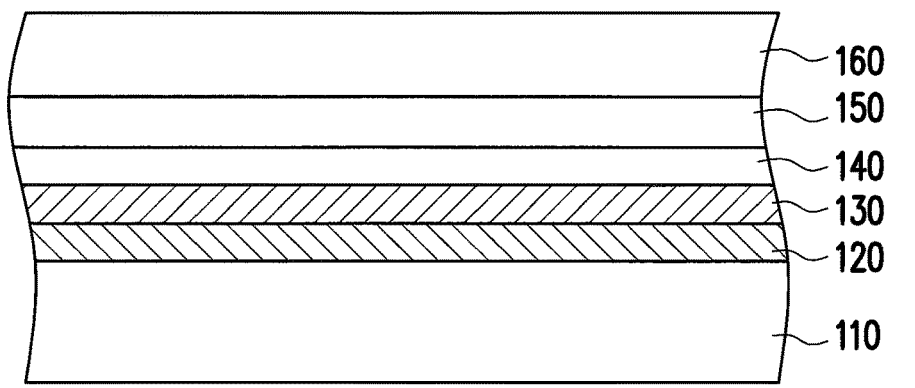
FIG. 3 is a schematic cross sectional view illustrating a mask blank according to some exemplary embodiments of the present disclosure.

FIG. 3 is a schematic cross sectional view illustrating a mask blank according to some exemplary embodiments of the present disclosure. As seen in FIG. 3, the mask blank 100C is similar to the mask blank 100B of FIG. 2. The elements similar to or substantially the same as the elements described previously will use the same reference numbers, and the descriptions of the same elements is not repeated herein. The difference is, in FIG. 3, the mask blank 100C further includes a hard mask layer 140. Referring to FIG. 3, in some embodiment, the hard mask layer 140 is located between the opaque layer 130 and the cooling layer 150. In some embodiments, a material of the hard mask layer 140, for example, includes MoSi or the like. For example, in FIG. 3, the hard mask layer 140 is directly disposed on the opaque layer 130 and immediately underneath the cooling layer, and the opaque layer 130 is sandwiched between the phase shifter 120 and the hard mask layer 140. However, the disclosure is not limited thereto. In some alternative embodiments, additional layer may present between the transparent substrate 110 and the phase shifter 120 or between the phase shifter 120 and the opaque layer 130, and between the opaque layer 130 and the hard mask layer 140 or between the hard mask layer 140 and the cooling layer 150. In some embodiments, the formation of the hard mask layer 140 includes a deposition process, such as CVD, PVD, a sputter method, ALD, and the like, for example.

In some embodiment, a thickness of the cooling layer 150 is greater than or equal to a thickness of a layer immediately underneath the cooling layer 150 and is less than or equal to a thickness of a layer immediately overlaying the cooling layer 150. For example, in FIG. 3, the mask blank 100C, since the mask blank 100C includes a laminated structure of the transparent substrate 110, the phase shifter 120, the opaque layer 130, the hard mask layer 140, the cooling layer 150 and the resist layer 160 sequentially stacked, the thickness of the cooling layer 150 is greater than or equal to a thickness of the hard mask layer and is less than or equal to a thickness of the resist layer 160.

Additionally, in some embodiments, the mask blanks 100A, 100B and 100C respectively depicted in FIG. 1 to FIG. 3 can be fabricated by sequentially forming layers on a light-transmitting/transparent substrate. For an exemplary example, the opaque layer 130 is formed on the transparent substrate 110, the cooling layer 150 is formed on the opaque layer 130, and the resist layer 160 is formed on the cooling layer 150 to form the mask blank 100B shown in FIG. 1. For another exemplary example, before forming the opaque layer 130, the cooling layer 150, and the resist layer 160, the phase shifter 120 is first formed on the transparent substrate 110; and, the opaque layer 130, the cooling layer 150, and the resist layer 160 are subsequently formed on the phase shifter 120 to form the mask blank 100B shown in FIG. 2. For an alternative exemplary example, before forming the opaque layer 130, the cooling layer 150, and the resist layer 160, the phase shifter 120 is first formed on the transparent substrate 110, then the opaque layer 130 is formed on the phase shifter 120; and before forming the cooling layer 150 and the resist layer 160, the hard mask layer 140 is formed on the opaque layer 130; and, the cooling layer 150 and the resist layer 160 are subsequently formed on the hard mask layer 140 to form the mask blank 100C shown in FIG. 3. The formation methods and materials of each of the above elements are described previously in FIG. 1 to FIG. 3, and the descriptions is not repeated herein. However, in the disclosure, the method of fabricating the mask blank is not limited thereto.

Figure 4:
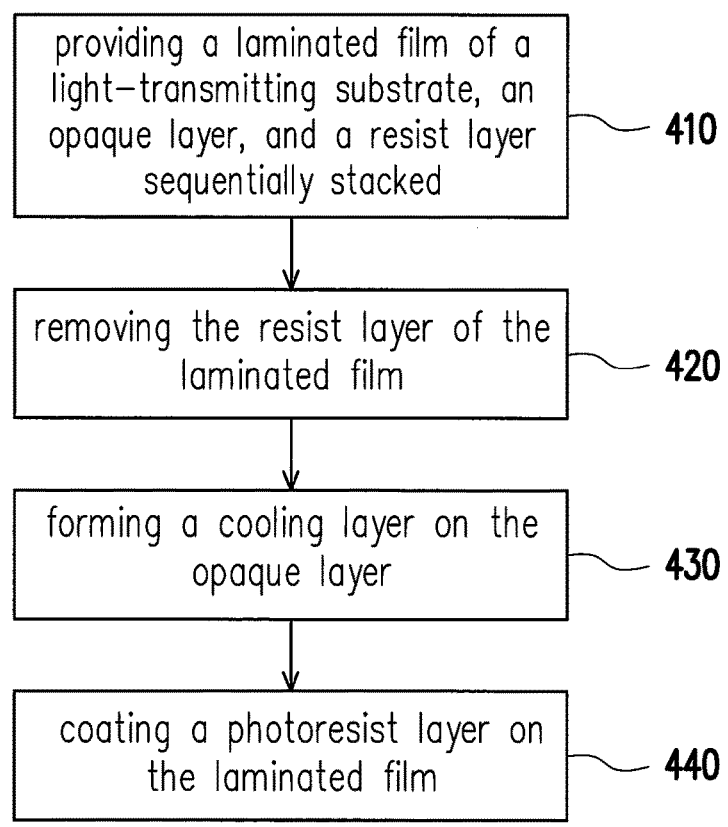
FIG. 4 is a flow chart of a method of fabricating a mask blank according to some exemplary embodiments of the present disclosure.

FIG. 4 is a flow chart of a method of fabricating a mask blank according to some exemplary embodiments of the present disclosure. One of ordinary skill in the art would understand that additional operations are able to be performed before, during, and/or after the method depicted in FIG. 4, in some embodiments. Referring to FIG. 4, in some embodiments, a method of fabricating a mask blank includes operation 410 to operation 440.

In operation 410, a laminated film is provided, in which the laminated film has a stacked structure of a light-transmitting substrate, an opaque layer, and a photoresist layer in order. In some embodiments, the laminated film further has a phase shifter, which has a stacked structure of the light-transmitting substrate, the phase shifter, the opaque layer, and the photoresist layer in order. In alternative embodiments, the laminated film further has a phase shifter and a hard mask, which has a stacked structure of the light-transmitting substrate, the phase shifter, the opaque layer, the hard mask layer and the photoresist layer in order.

In operation 420, the photoresist layer is entirely removed from the laminated film so as to expose the opaque layer. In some embodiments, the removal of the photoresist layer includes performing a resist stripping process or a resist ashing process, however the disclosure is not limited thereto.

In operation 430, a cooling layer is formed on the opaque layer, and the cooling layer has a thermal conductivity (k) of about $160 \leq k \leq 5000$ and an effective atomic number ($Z_{eff}$) of about $5 \leq Z_{eff} \leq 14$. In some embodiments, forming the cooling layer includes a sputter method.

In operation 440, a resist layer is coated on the cooling layer, such that the resist layer physically contacts/connects the cooling layer. In some embodiments, the resist layer, for example, includes a positive resist layer or a negative resist layer. In some embodiments, coating the resist layer includes a spin-on coating method, and the like, for example. Based on the method depicted in FIG. 4, the fabrication of the mask blank in the disclosure has the advantages, such as ease of fabricating processing and mass production and low fabricating cost.

FIG. 5A to FIG. 5E are schematic cross sectional views of various stages in a method of fabricating a photomask according to some exemplary embodiments of the present disclosure.

Figure 5A:
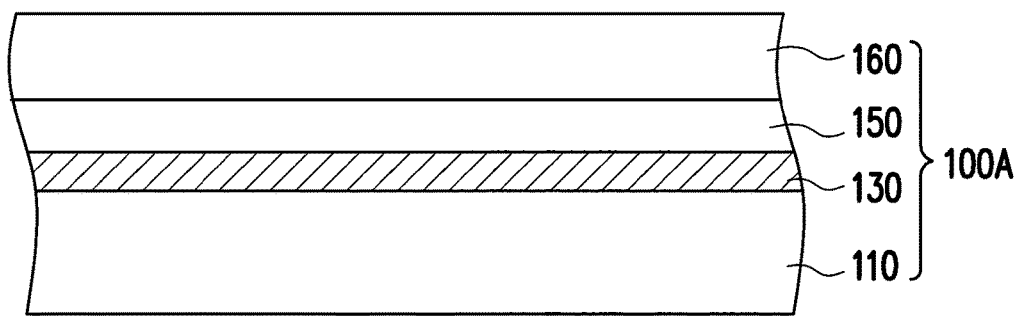
FIG. 5A to FIG. 5E are schematic cross sectional views of various stages in a method of fabricating a photomask according to some exemplary embodiments of the present disclosure.

Referring to FIG. 5A, in some embodiments, a mask blank 100A is provided. The mask blank 100A depicted in FIG. 5A is the same as the mask blank 100A depicted in FIG. 1, in which the mask blank 100A includes a transparent substrate 110 (e.g. a light-transmitting substrate), an opaque layer 130, a cooling layer 150, and a resist layer 160. In certain embodiments, the opaque layer 130 is located between the transparent substrate 110 and the cooling layer 150, the cooling layer 150 is located between the opaque layer 130 and the resist layer 160, and the resist layer 160 physically contacts the cooling layer 150. In some embodiments, the cooling layer 150 is formed by sputtering, chemical vapor deposition, spin-coating or even thermal processes, and the cooling layer 150 has a thickness of about 3 nm to 100 nm. In some embodiments, a material of the cooling layer 150 includes aluminum nitride, silicon carbide, boron nitride, or graphene, and the material of the cooling layer 150 has the thermal conductivity (k) of about $160 \leq k \leq 5000$ and the effective atomic number ($Z_{eff}$) of about $5 \leq Z_{eff} \leq 14$. The materials and formation methods of the transparent substrate 110, the opaque layer 130, the cooling layer 150, and the resist layer 160 are substantially the same or similar to those described in FIG. 1 and the associated description, may not be repeated herein.

Figure 5B:
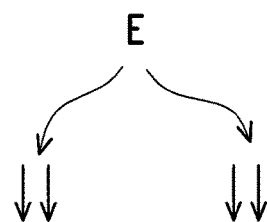
Figure 5B:
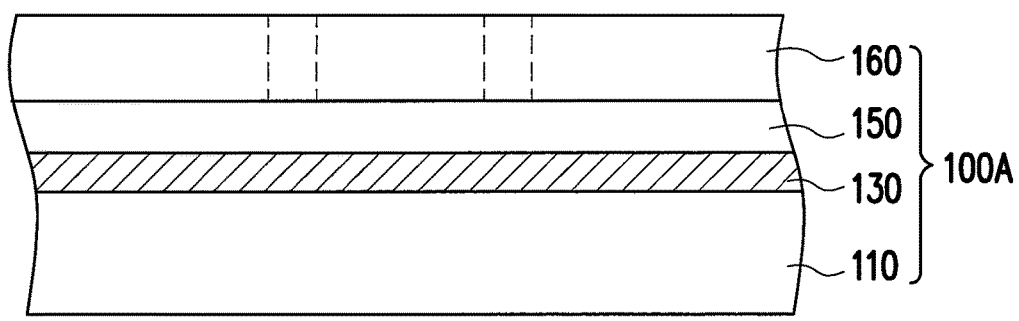

Referring to FIG. 5B, in some embodiments, an exposure process E is performed on the resist layer 160. In some embodiments, the exposure process E may include a lithography technique with a mask (for instance, a photolithography process) or a mask-less lithography technique (for instance, an electron-beam (e-beam) exposure process or an ion-beam exposure process). For example, in FIG. 5B, the exposure process E includes performing an electron-beam exposure process (known as "e-beam writing" or "e-beam direct writing"). In some embodiments, the electron-beam exposure process is performed by irradiating electron-beams onto the resist layer 160 to transfer a predetermined target pattern to the resist layer 160. In some embodiments, after the electron-beam exposure process, a post-baking process may be performed to the resist layer 160. Depending on the material(s) or type of the resist layer 160, polymers of the resist layer 160 may undergo different reactions (chains scission or cross-linking of polymers) upon the irradiation of the electron beams and baking. In some embodiments, the portions of the positive resist material exposed to the e-beam undergo the reaction of chain scission, which is easily removed by a development agent as comparing to a portion of the positive resist material not exposing to the e-beam. On the other hand, the portions of the negative resist material exposed to the e-beam undergo the reaction of cross-linking, which is hard to be removed by a development agent as comparing to a portion of the negative resist material not exposing to the e-beam.

Figure 5C:
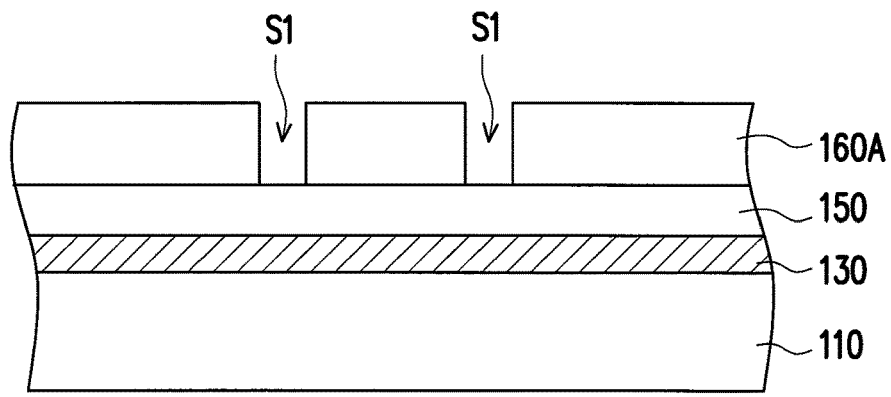

Referring to FIG. 5C, in some embodiments, a portion of the resist layer 160 is removed to form a patterned resist layer 160A with openings S1 exposing a portion of the cooling layer 150. In some embodiments, portions of the resist layer 160, which are exposed to the e-beam or not exposed to the e-beam, are removed with a development agent in a subsequent developing process. For example, in FIG. 5C, the material of the resist layer 160 is a positive resist material, and the portions of the resist layer 160, which are exposed to the e-beam, are removed to form the openings S1 with a development agent. However, the disclosure is not limited thereto; in an alternative embodiment, the material of the resist layer 160 is, for example, a negative resist material, the portions of the resist layer 160, which are not exposed to the e-beam, are removed with a development agent. The development agent may be chosen based on the material of the resist layer as well as process needs.

The electron beam exposure process is a well-known technology in patterning for the fabrication of submicron patterns. In order to increase the throughput of pattern writing, the exposure is often applied with high current density of the energy source. It is possible that an incident e-beam of high current density causes a serious proximity scattering and resist heating effect due to the nature of an energy distribution. The proximity scattering deteriorates critical dimension (CD) control of the patterning process, and the resist heating effect causes deformation of the resist. In detail, the interactions between the incident electrons (e.g., the electrons of e-beam) and a solid material (e.g. the electron cloud or nucleus of solid material) takes place in the ways of either an inelastic collision or an elastic collision. The elastic collision occurs between the incident electrons and the nucleus of the solid material in a back-scattering electron regime, which the incident electrons retain most of the energy, thereby resulting a larger scattering angle (e.g. proximity scattering). With such larger scattering angle, the predetermined target pattern to be transferred onto the resist layer 160 is likely affected, and then results in a larger critical dimension than the expected. Since the cooling layer 150 has a smaller effective atomic number ($Z_{eff}$) of about $5 \leq Z_{eff} \leq 14$ and the cooling layer 150 is located right underneath the resist layer 160, the scattering angle of the electrons can be controlled and/or decreased, and a smaller critical dimension for patterning can be achieved.

Furthermore, during the electron beam exposure process with a high current density, heat can be easily accumulated in a layer of low thermal conductivity. In a mask blank, the layer immediately underneath the photoresist layer or the resist layer usually is a silicon-based or chromium-based oxidation material of low thermal conductivity, and the heat is likely accumulated in such material layer, leading to the resist heating effect. Due to the presence of the cooling layer 150 having a higher thermal conductivity (k) of about $160 \leq k \leq 5000$ immediately underneath the resist layer 160, the heat from the e-beam and the interaction of the incident electrons and the solid material can be easily dissipated by the cooling layer 150, thereby preventing the resist deformation. In addition, owing to the existence of the cooling layer 150 and the relative position configuration thereof, critical dimension uniformity of the patterned feature sequentially formed is improved by 10-50%.

Figure 5D:
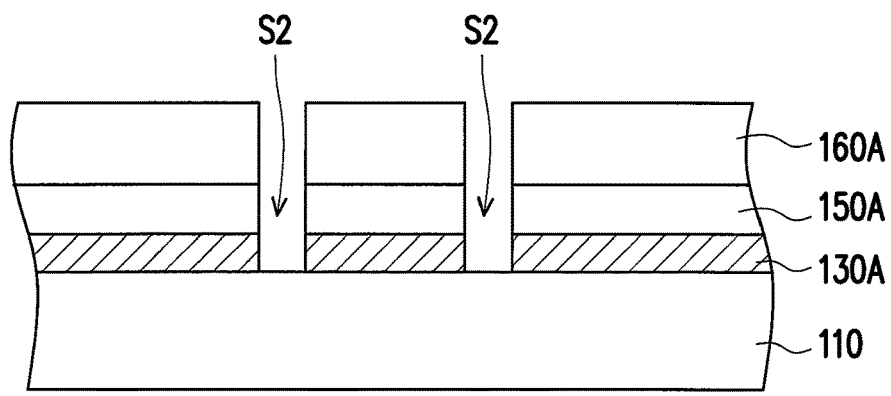

Referring to FIG. 5D, in some embodiments, the opaque layer 130 and the cooling layer 150 are patterned. In some embodiments, the patterning process includes performing a dry etching process, a wet etching process, or a combination thereof. For example, in FIG. 5D, the patterned resist layer 160A is used as the etching mask in a dry etching process for removing a portion of the cooling layer 150 and a portion of the opaque layer 130, so as to form a patterned opaque layer 130A and a patterned cooling layer 150A with openings S2 exposing the transparent substrate 110. The disclosure is not limited thereto. In alternative embodiments, the opaque layer 130 and the cooling layer 150 may be patterned sequentially by different etching processes (i.e. the portion of the cooling layer 150 and the portion of the opaque layer 130 are removed in different etching steps). For example, the cooling layer 150 is patterned to form the patterned cooling layer 150A by using the patterned resist layer 160A as the etching mask, and then the opaque layer 130 is patterned to form the patterned opaque layer 130A by using the patterned cooling layer 150A as the etching mask.

Figure 5E:
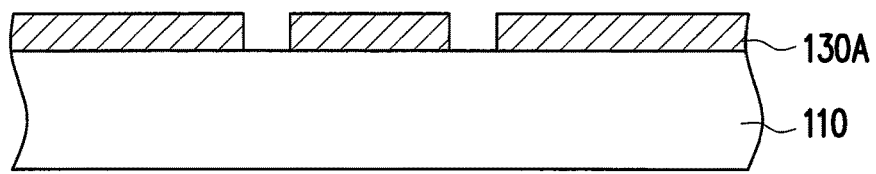

Referring to FIG. 5E, in some embodiments, the patterned resist layer 160A and the patterned cooling layer 150A are removed. In some embodiments, the removal of the patterned resist layer 160A and the patterned cooling layer 150A includes performing a resist stripping processes, a resist ashing processes or a cooling layer stripping process. For example, in FIG. 5E, the patterned resist layer 160A and the patterned cooling layer 150A are completely removed from the patterned opaque layer 130A to form a photomask PM1.

FIG. 6A to FIG. 6F are schematic cross sectional views of various stages in a method of fabricating a photomask according to some exemplary embodiments of the present disclosure. The elements similar to or substantially the same as the elements described previously will use the same reference numbers, and certain details or descriptions of the same elements may not be repeated herein.

Figure 6A:
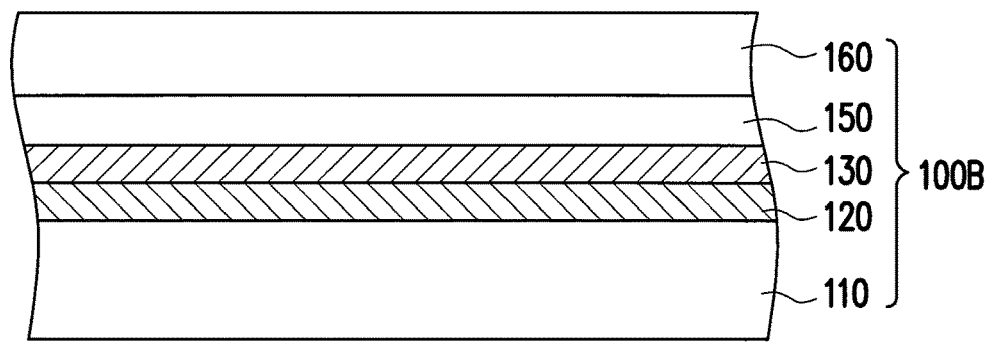
FIG. 6A to FIG. 6F are schematic cross sectional views of various stages in a method of fabricating a photomask according to some exemplary embodiments of the present disclosure.

Referring to FIG. 6A, in some embodiments, a mask blank 100B is provided. The mask blank 100B depicted in FIG. 6A is the same as the mask blank 100B depicted in FIG. 2, in which the mask blank 100B includes a transparent substrate 110 (e.g. a light-transmitting substrate), a phase shifter 120, an opaque layer 130, a cooling layer 150, and a resist layer 160. In certain embodiments, the phase shifter 120 is located between the transparent substrate 110 and the opaque layer 130, the opaque layer 130 is located between the phase shifter 120 and the cooling layer 150, the cooling layer 150 is located between the opaque layer 130 and the resist layer 160, and the resist layer 160 physically contacts the cooling layer 150. In some embodiments, the cooling layer 150 is formed by sputtering, chemical vapor deposition, spin-coating or even thermal processes, and the cooling layer 150 has a thickness of about 3 nm to 100 nm. In some embodiments, a material of the cooling layer 150 includes aluminum nitride, silicon carbide, boron nitride, or graphene, and the material of the cooling layer 150 has the thermal conductivity (k) of about $160 \leq k \leq 5000$ and the effective atomic number ($Z_{eff}$) of about $5 \leq Z_{eff} \leq 14$. The materials and formation methods of the transparent substrate 110, the phase shifter 120, the opaque layer 130, the cooling layer 150, and the resist layer 160 are substantially the same or similar to those described in FIG. 2 and the associated description, and may not be repeated herein.

Figure 6B:
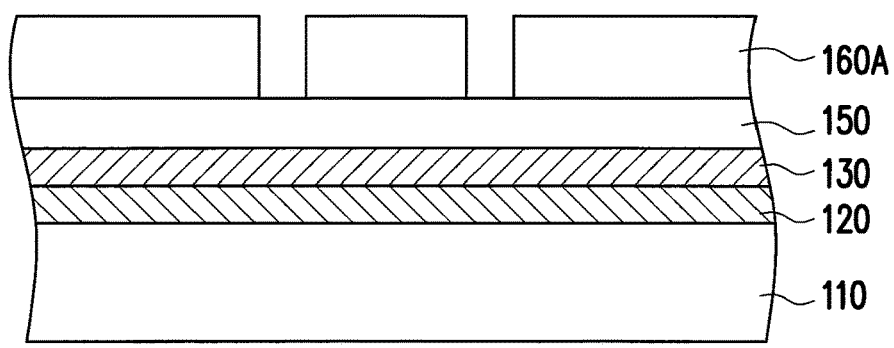

Referring to FIG. 6B, in some embodiments, a portion of the resist layer 160 is removed to form a patterned resist layer 160A exposing a portion of the cooling layer 150. The removal method of the resist layer 160 is substantially the same or similar to those described in FIG. 5B to FIG. 5C and the associated descriptions, may not be repeated herein. Due to the cooling layer 150 having a small effective atomic number ($Z_{eff}$) of about $5 \leq Z_{eff} \leq 14$ and in physical contact with the resist layer 160, the scattering angle of the electrons during the exposure process can be controlled and/or decreased, and a smaller critical dimension for patterning can be obtained. Owing to the cooling layer 150 having a high thermal conductivity (k) of about $160 \leq k \leq 5000$ and in direct contact with the resist layer 160, the heat resultant from the e-beam and the interaction of the incident electrons and the solid material during the exposure process can be easily dissipated by the cooling layer 150, thereby preventing the resist deformation. In addition, because of the existence of the cooling layer 150 and its relative position configuration, the critical dimension uniformity of the patterned feature subsequently formed can be improved by 10-50%.

Figure 6C:
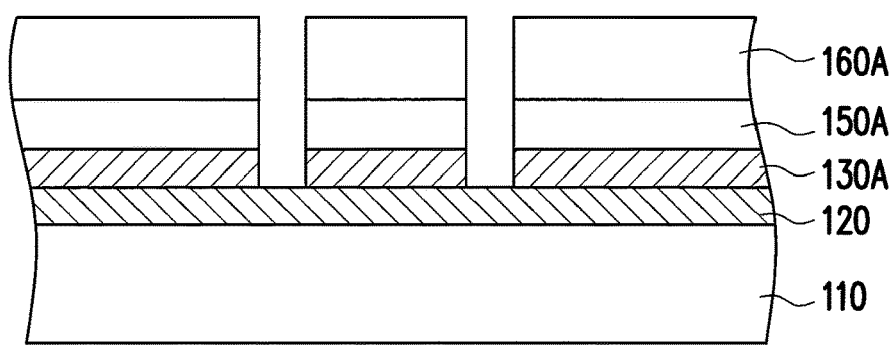

Referring to FIG. 6C, in some embodiments, the cooling layer 150 and the opaque layer 130 are patterned. The patterning methods of the opaque layer 130 and the cooling layer 150 are substantially the same or similar to those described in FIG. 5D and may not be repeated herein. For example, in FIG. 6C, the patterned resist layer 160A is used as the etching mask in a dry etching process for a removal of a portion of the cooling layer 150 and a portion of the opaque layer 130, so as to form a patterned opaque layer 130A and a patterned cooling layer 150A.

Figure 6D:
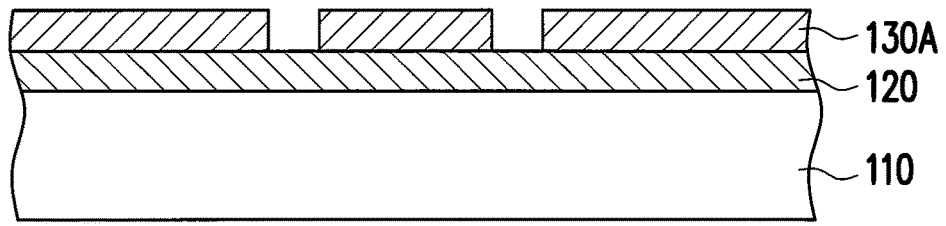

Referring to FIG. 6D, in some embodiments, the patterned resist layer 160A and the patterned cooling layer 150A are removed. The removal methods of the patterned resist layer 160A and the patterned cooling layer 150A are substantially the same or similar to those described in FIG. 5E and may not be repeated herein. For example, in FIG. 6D, the patterned resist layer 160A and the patterned cooling layer 150A is completely removed from the patterned opaque layer 130A.

Figure 6E:
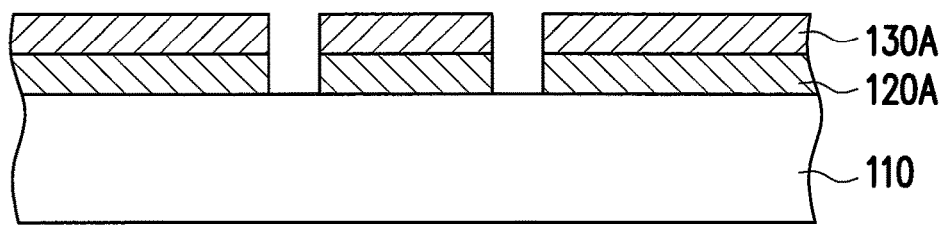

Referring to FIG. 6E, in some embodiments, the phase shifter 120 is patterned. In some embodiments, the patterning process includes performing a dry etching process, a wet etching process, or a combination thereof. By tuning the etch selectivity, the performed etching process can be controlled to etch away a material of the phase shifter 120, instead of a material of the patterned opaque layer 130A. For example, in FIG. 6E, the patterned opaque layer 130A is used as the etching mask in a dry etching process for removing a portion of the phase shifter 120, so as to form a patterned phase shifter 120A.

Figure 6F:
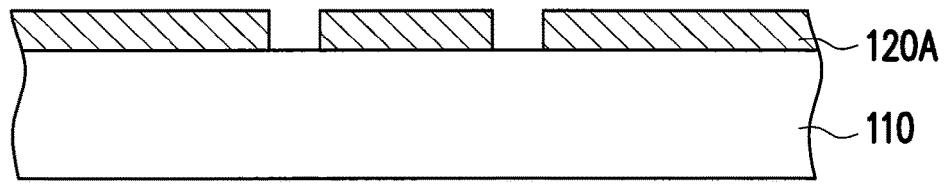

Referring to FIG. 6F, in some embodiments, the patterned opaque layer 130A is removed. In some embodiments, the removal method of the patterned opaque layer 130A includes a dry etching process, a wet etching process, or a combination thereof. By tuning the etch selectivity, the performed etching process can be controlled to etch away a material of the patterned opaque layer 130A, instead of a material of the patterned phase shifter 120A. For example, in FIG. 6F, the patterned opaque layer 130A is completely removed from the patterned phase shifter 120A to form a photomask PM2.

FIG. 7A to FIG. 7D are schematic cross sectional views of various stages in a method of fabricating a photomask according to some exemplary embodiments of the present disclosure. The elements similar to or substantially the same as the elements described previously will use the same reference numbers, and certain details or descriptions of the same elements may not be repeated herein.

Figure 7A:
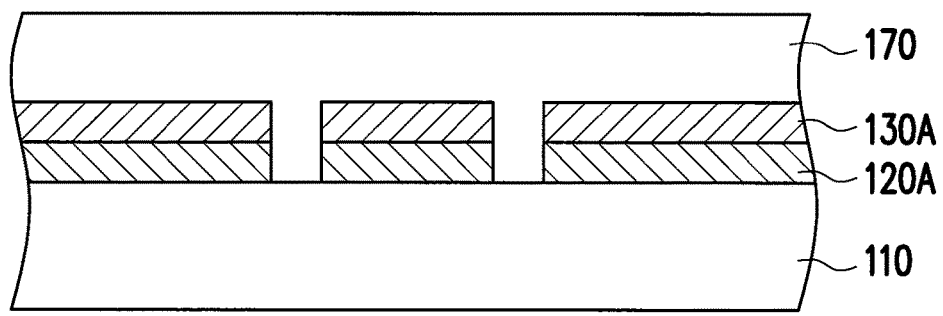
FIG. 7A to FIG. 7D are schematic cross sectional views of various stages in a method of fabricating a photomask according to some exemplary embodiments of the present disclosure.

Referring in FIG. 7A, in some embodiments, a first resist layer 170 is coated on the patterned opaque layer 130A and the patterned phase shifter 120A, following the process as described in FIG. 6E. In some embodiments, a material of the first resist layer 170, for example, includes a positive resist material or a negative resist material, that is suitable for a subsequent patterning process such as a photolithography process with a mask or a mask-less photolithography process (for instance, an electron-beam (e-beam) writing or an ion-beam writing). In alternative embodiments, a material of the first resist layer 170, for example, includes an organic compound that is deposited a substrate for biomedical chip. In some embodiments, the materials and formation methods of the first resist layer 170 and the resist layer 160 can be substantially the same or different, the disclosure is not limited thereto.

Figure 7B:
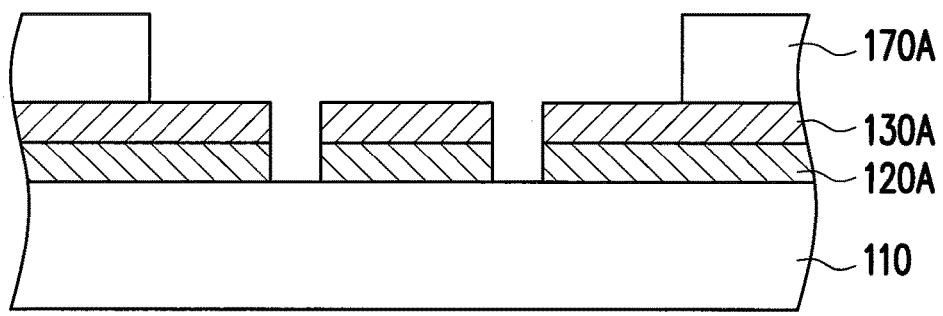

Referring in FIG. 7B, in some embodiments, a portion of the first resist layer 170 is removed to form a patterned first resist layer 170A exposing a portion of the patterned opaque layer 130A. In some embodiments, an exposure process is performed on a portion of the first resist layer 170, and the portion of the first resist layer 170 is removed with a development agent in a developing process to form a patterned resist layer 170A, in which a portion of the patterned opaque layer 130A is exposed by the patterned first resist layer 170A, as shown in FIG. 7B. The predetermined target pattern to be transferred onto the resist layer 160 is different from a predetermined target pattern to be transferred onto the first resist layer 170. The exposure processes and removal methods of the first resist layer 170 and the resist layer 160 can be substantially the same or different, the disclosure is not limited thereto.

Figure 7C:
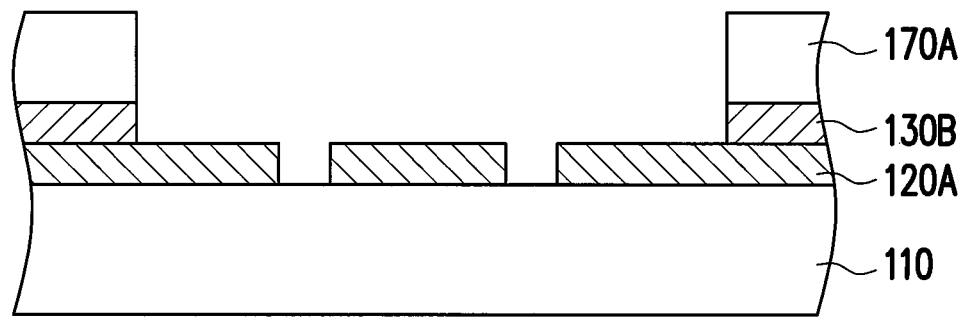

Referring in FIG. 7C, in some embodiments, a portion of the patterned opaque layer 130A is removed. In some embodiments, the removal method of the portion of the patterned opaque layer 130A includes a dry etching process, a wet etching process, or a combination thereof. By tuning the etch selectivity, the performed etching process can be controlled to etch away a material of the patterned opaque layer 130A, instead of a material of the patterned phase shifter 120A. For example, in FIG. 7C, the patterned first resist layer 170A is used as the etching mask in a dry etching process for removing a portion of the patterned opaque layer 130A, so as to form a patterned opaque layer 130B.

Figure 7D:
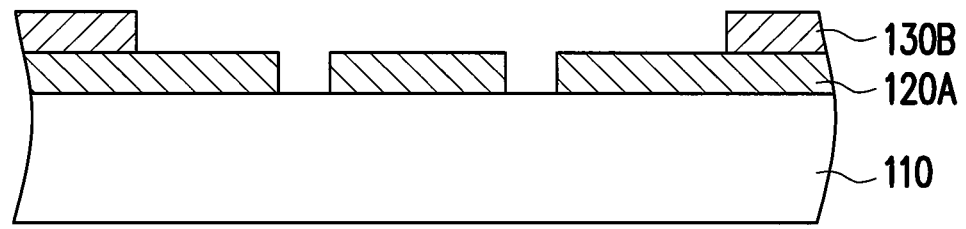

Referring to FIG. 7D, in some embodiments, the patterned first resist layer 170A is removed. The removal methods of the patterned first resist layer 170A and the patterned resist layer 160A can be the same or different, the disclosure is not limited thereto. For example, in FIG. 7D, the patterned first resist layer 170A is completely removed from the patterned opaque layer 130B to form a photomask PM3.

FIG. 8A to FIG. 8K are schematic cross sectional views of various stages in a method of fabricating a photomask according to some exemplary embodiments of the present disclosure. The elements similar to or substantially the same as the elements described previously will use the same reference numbers, and certain details or descriptions of the same elements may not be repeated herein.

Figure 8A:
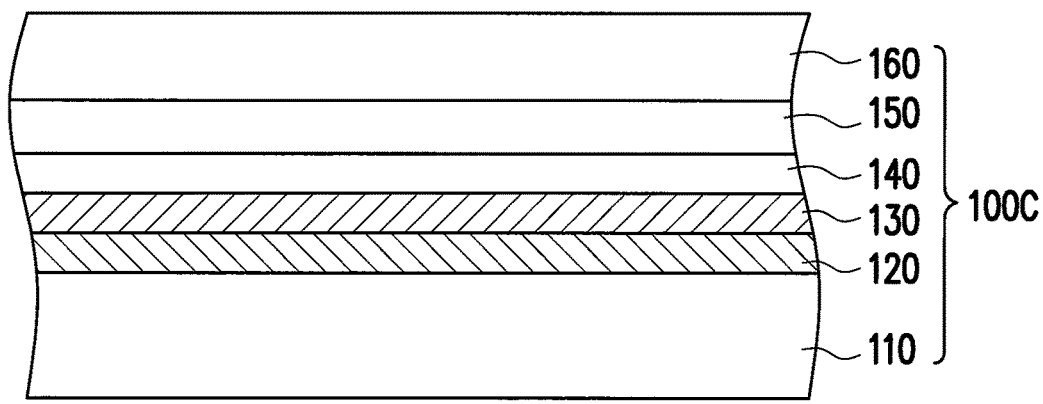
FIG. 8A to FIG. 8K are schematic cross sectional views of various stages in a method of fabricating a photomask according to some exemplary embodiments of the present disclosure.

Referring to FIG. 8A, in some embodiments, a mask blank 100C is provided. The mask blank 100C depicted in FIG. 8A is the same as the mask blank 100C depicted in FIG. 3, in which the mask blank 100C includes a transparent substrate 110 (e.g. a light-transmitting substrate), a phase shifter 120, an opaque layer 130, a hard mask layer 140, a cooling layer 150, and a resist layer 160. In certain embodiments, the phase shifter 120 is located between the transparent substrate 110 and the opaque layer 130, the opaque layer 130 is located between the phase shifter 120 and the hard mask layer 140, the hard mask layer 140 is located between the opaque layer 130 and the cooling layer 150, and the cooling layer 150 is located between the hard mask layer 140 and the resist layer 160. The resist layer 160 physically contacts the cooling layer 150. In some embodiments, the cooling layer 150 is formed by sputtering, chemical vapor deposition, spin-coating or even thermal processes, and the cooling layer 150 has a thickness of about 3 nm to 100 nm. In some embodiments, a material of the cooling layer 150 includes aluminum nitride, silicon carbide, boron nitride, or graphene, and the material of the cooling layer 150 has the thermal conductivity (k) of about 160≤k≤5000 and the effective atomic number ($Z_{eff}$) of about 5≤$Z_{eff}$≤14. The materials and formation methods of the transparent substrate 110, the phase shifter 120, the opaque layer 130, the hard mask layer 140, the cooling layer 150, and the resist layer 160 are substantially the same or similar to those described in FIG. 3 and the associated description, may not be repeated herein.

Figure 8B:
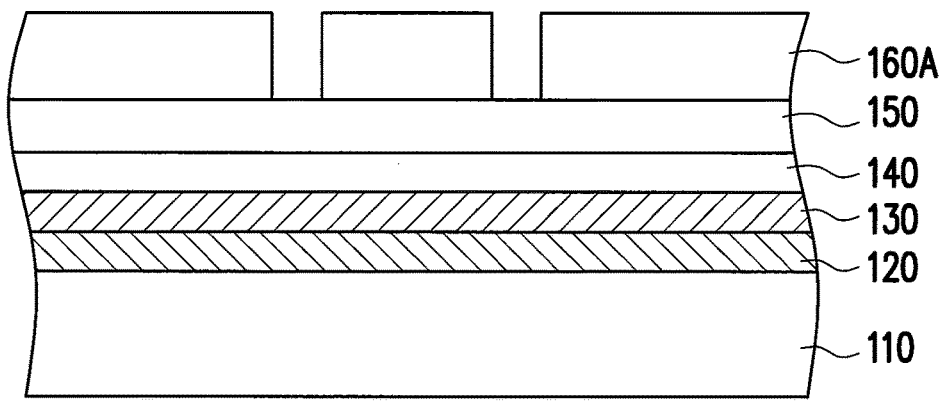

Referring to FIG. 8B, in some embodiments, a portion of the resist layer 160 is removed to form a patterned resist layer 160A exposing a portion of the cooling layer 150. The exposure process and removal method of the resist layer 160 and the formation method of the patterned resist layer 160A are substantially the same or similar to those described in FIG. 5B to FIG. 5C and the associated descriptions, and may not be repeated herein. Due to the cooling layer 150 having a small effective atomic number ($Z_{eff}$) of about 5≤$Z_{eff}$≤14 and a high thermal conductivity (k) of about 160≤k≤5000 and being in physically contact with the resist layer 150, not only the scattering angle of the electrons during the exposure process can be controlled and/or decreased, but the heat resultant from the e-beam and the interaction of the incident electrons and the solid material during the exposure process can also be easily dissipated by the cooling layer 150, thereby obtaining a smaller critical dimension for patterning and preventing the resist deformation. In addition, because of the existence of the cooling layer 150 and its relative positioning configuration, the critical dimension uniformity of the patterned feature subsequently formed is improved by 10-50%.

Figure 8C:
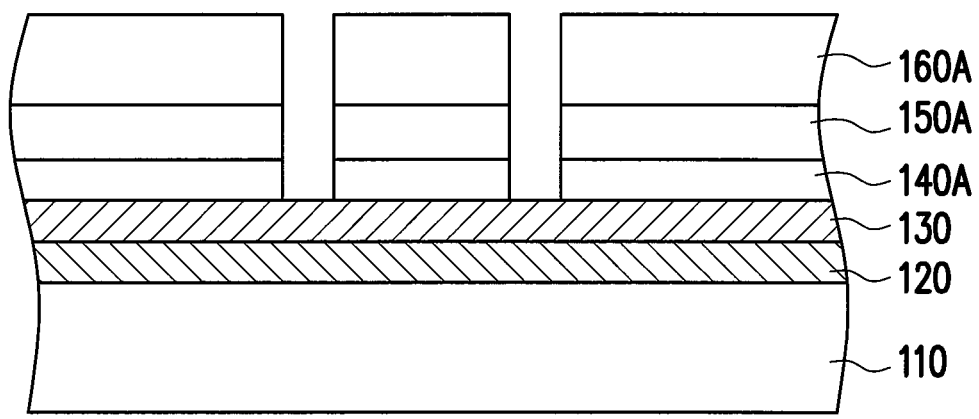

Referring to FIG. 8C, in some embodiments, the cooling layer 150 and the hard mask layer 140 are patterned. In some embodiments, the patterning process includes performing a dry etching process, a wet etching process, or a combination thereof. For example, in FIG. 8C, the patterned resist layer 160A is used as the etching mask in a dry etching process for removing a portion of the cooling layer 150 and a portion of the hard mask layer 140, so as to form a patterned hard mask layer 140A and a patterned cooling layer 150A. The disclosure is not limited thereto. In alternative embodiments, the opaque layer 130 and the cooling layer 150 may be patterned sequentially by different etching processes (i.e. the portion of the cooling layer 150 and the portion of the hard mask layer 140 are removed in different etching steps). For example, the cooling layer 150 is patterned to form the patterned cooling layer 150A by using the patterned resist layer 160A as the etching mask, and then the hard mask layer 140 is patterned to form the patterned hard mask layer 140A by using the patterned cooling layer 150A as the etching mask.

Figure 8D:
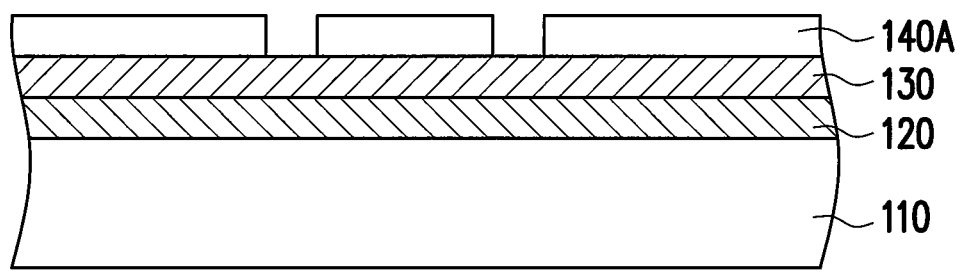

Referring to FIG. 8D, in some embodiments, the patterned resist layer 160A and the patterned cooling layer 150A are removed. The removal methods of the patterned resist layer 160A and the patterned cooling layer 150A are substantially the same or similar to those described in FIG. 5E and may not be repeated herein. For example, in FIG. 8D, the patterned resist layer 160A and the patterned cooling layer 150A is completely removed from the patterned hard mask layer 140A.

Figure 8E:
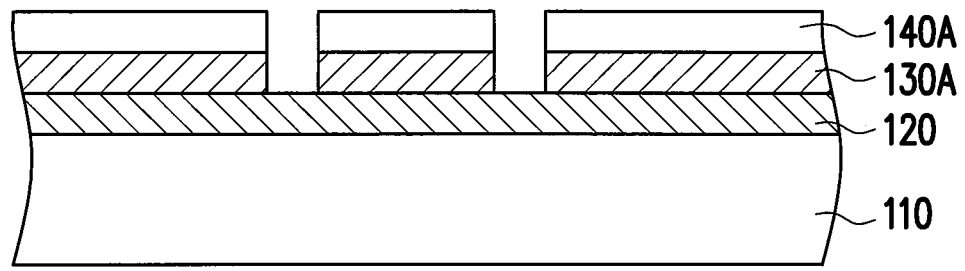

Referring to FIG. 8E, in some embodiments, the opaque layer 130 is patterned. In some embodiments, the patterning process of the patterned opaque layer 130A includes performing a dry etching process, a wet etching process, or a combination thereof. By tuning the etch selectivity, the performed etching process can be controlled to etch away a material of the opaque layer 130, instead of materials of the patterned hard mask layer 140A and the phase shifter 120. For example, in FIG. 8E, the patterned hard mask layer 140A is used as an etching mask in a dry etching process for removing a portion of the opaque layer 130, so as to form a patterned opaque layer 130A exposing a portion of the phase shifter 120.

Figure 8F:
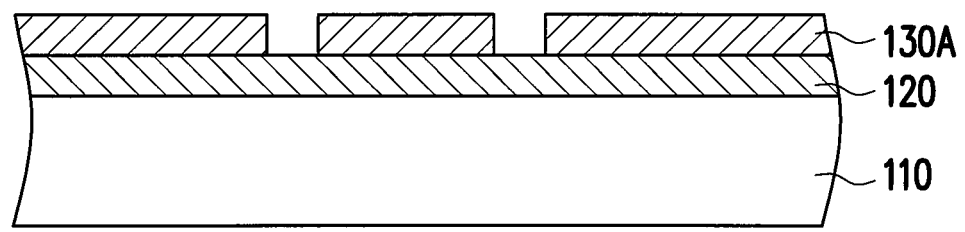

Referring in FIG. 8F, in some embodiments, the patterned hard mask layer 140A is removed. In some embodiments, the removal method of the patterned hard mask layer 140A includes performing a dry etching process, a wet etching process, or a combination thereof. By tuning the etch selectivity, the performed etching process can be controlled to etch away a material of the patterned hard mask layer 140A, instead of materials of the patterned opaque layer 130A and the phase shifter 120. For example, in FIG. 8F, the patterned hard mask layer 140A is completely removed from the patterned opaque layer 130A.

Figure 8G:
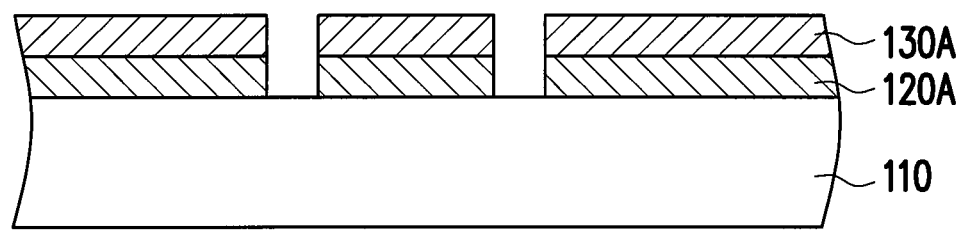

Referring in FIG. 8G, in some embodiments, in some embodiments, the phase shifter 120 is patterned. In some embodiments, the patterning process includes performing a dry etching process, a wet etching process, or a combination thereof. By tuning the etch selectivity, the performed etching process can be controlled to etch away a material of the phase shifter 120, instead of material of the patterned opaque layer 130A. For example, in FIG. 8G, the patterned opaque layer 130A is used as the etching mask in a dry etching process for a removal of a portion of the phase shifter 120, so as to form a patterned phase shifter 120A.

Figure 8H:
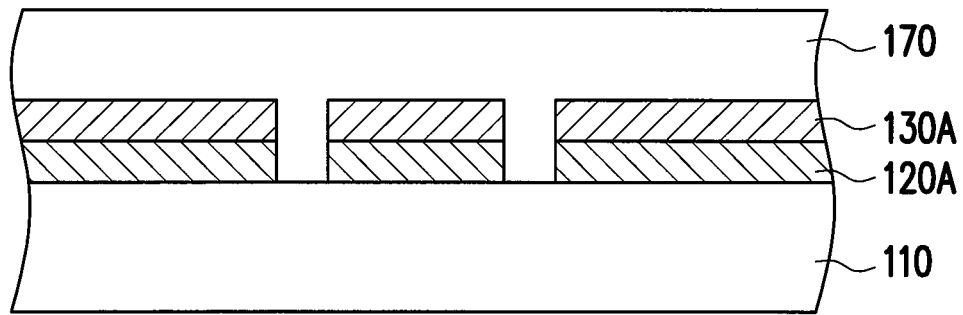

Referring in FIG. 8H, in some embodiments, a first resist layer 170 is coated on the patterned opaque layer 130A and the patterned phase shifter 120A. The material and formation methods of the first resist layer 170 are substantially the same or similar to those described in FIG. 7A and may not be repeated herein. In some embodiments, the materials and formation methods of the first resist layer 170 and the resist layer 160 can be substantially the same or different, the disclosure is not limited thereto.

Figure 8I:
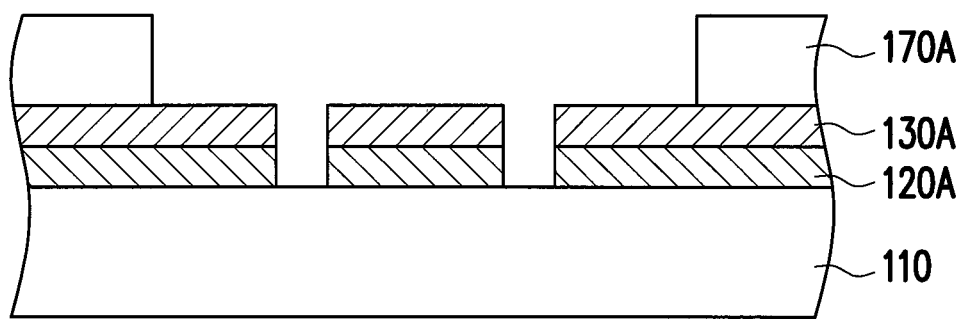

Referring in FIG. 8I, in some embodiments, a portion of the first resist layer 170 is removed to form a patterned first resist layer 170A exposing a portion of the patterned opaque layer 130A. The removal methods of the portion of the first resist layer 170 is substantially the same or similar to those described in FIG. 7B and may not be repeated herein. The predetermined target pattern to be transferred onto the resist layer 160 is different from a predetermined target pattern to be transferred onto the first resist layer 170. The exposure processes and removal methods of the first resist layer 170 and the resist layer 160 can be substantially the same or different, the disclosure is not limited thereto.

Figure 8J:
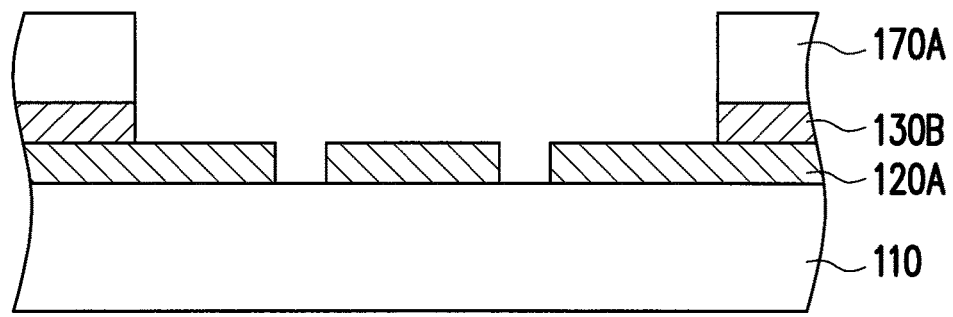

Referring in FIG. 8J, in some embodiments, a portion of the patterned opaque layer 130A is removed. The removal methods of the portion of the patterned opaque layer 130A is substantially the same or similar to those described in FIG.

7C and may not be repeated herein. For example, in FIG. 8J, the patterned first resist layer 170A is used as the etching mask in a dry etching process for removing a portion of the patterned opaque layer 130A, so as to form a patterned opaque layer 130B exposing a portion of the patterned phase shifter 120A.

Figure 8K:
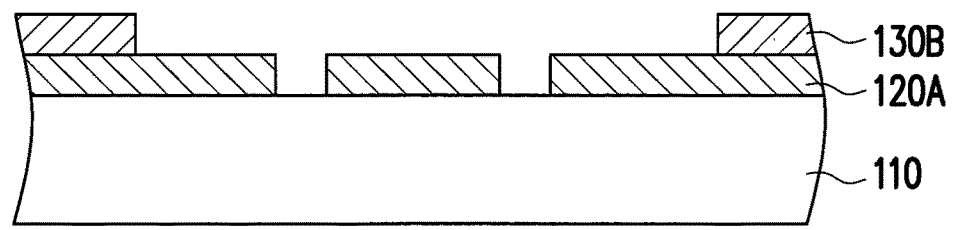

Referring to FIG. 8K, in some embodiments, the patterned first resist layer 170A is removed. The removal methods of the patterned first resist layer 170A and the patterned resist layer 160A can be substantially the same or different, the disclosure is not limited thereto. For example, in FIG. 8K, the patterned first resist layer 170A is completely removed from the patterned opaque layer 130B to form a photomask PM4.

According to some embodiments, a method of fabricating a photomask is provided. The photomask is formed by providing a mask blank; removing a portion of the resist layer to form a patterned resist layer exposing a portion of the cooling layer; patterning the cooling layer by using the patterned resist layer as an etching mask; patterning the opaque layer; and removing the patterned resist layer and the patterned cooling layer. The mask blank includes a light-transmitting substrate and an opaque layer, a cooling layer, and a resist layer sequentially stacked thereon, wherein the cooling layer has a thermal conductivity ranging between 160 and 5000 and an effective atomic number ranging between 5 and 14.

According to some embodiments, a mask blank is provided. The mask blank includes a transparent substrate, an opaque layer disposed on the transparent substrate, a cooling layer disposed on the opaque layer, and a resist layer disposed on the cooling layer. A thermal conductivity of the cooling layer is between 160 and 5000, and an effective atomic number of the cooling layer is between 5 and 14.

According to some embodiments, a method of manufacturing a mask blank is provided. The mask blank is formed by providing a laminated film of a light-transmitting substrate, an opaque layer, and a photoresist layer sequentially stacked; removing the photoresist layer of the laminated film; forming a cooling layer on the opaque layer; and coating a resist layer on the laminated film. A thermal conductivity of the cooling layer is between 160 and 5000, and an effective atomic number of the cooling layer is between 5 and 14.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a photomask, comprising:
providing a mask blank comprising a transparent substrate, an opaque layer, a cooling layer, and a resist layer sequentially stacked thereon, wherein the cooling layer has a thermal conductivity ranging between 160 and 5000 and an effective atomic number ranging between 5 and 14, wherein a thickness of the cooling layer is equal to a thickness of the resist layer;
removing a portion of the resist layer to form a patterned resist layer exposing a portion of the cooling layer;
patterning the cooling layer by using the patterned resist layer as a mask;
patterning the opaque layer; and
removing the patterned resist layer and the patterned cooling layer.

2. The method of claim 1, wherein providing the mask blank comprises:
providing a laminated film of the transparent substrate, the opaque layer, and a photoresist layer sequentially stacked;
removing the photoresist layer of the laminated film;
forming the cooling layer on the opaque layer; and
coating the resist layer on the cooling layer over the laminated film.

3. The method of claim 2, wherein forming the cooling layer comprises sputtering the cooling layer blanketly covering the opaque layer over the transparent substrate have a thickness ranging from about 3 nm to about 100 nm.

4. The method of claim 2, wherein forming the cooling layer comprises depositing a layer of aluminum nitride, silicon carbide, boron nitride, or graphene blanketly over the opaque layer.

5. The method of claim 1, wherein providing the mask blank further comprises forming a phase shifter between the transparent substrate and the opaque layer, and
after removing the patterned resist layer and the patterned cooling layer, the method further comprises:
patterning the phase shifter by using the patterned opaque layer as a mask.

6. The method of claim 5, further comprising:
removing the patterned opaque layer after patterning the phase shifter.

7. The method of claim 5, further comprising:
coating a first resist layer on the patterned opaque layer and the patterned phase shifter;
removing a portion of the first resist layer to form a patterned first resist layer exposing a portion of the patterned opaque layer;
removing the patterned opaque layer by using the patterned first resist layer as a mask; and
removing the patterned first resist layer.

8. The method of claim 1, wherein providing the mask blank further comprises forming a phase shifter between the transparent substrate and the opaque layer and forming a hard mask layer between the opaque layer and the cooling layer, the method further comprises:
patterning the hard mask layer before patterning the opaque layer by using the patterned resist layer as a mask, wherein patterning the opaque layer comprises using the patterned hard mask layer as a mask after removing the patterned resist layer and the patterned cooling layer;
removing the patterned hard mask layer; and
patterning the phase shifter by using the patterned opaque layer as a mask.

9. The method of claim 8, further comprising:
coating a first resist layer on the patterned opaque layer and the patterned phase shifter;
removing a portion of the first resist layer to form a patterned first resist layer exposing a portion of the patterned opaque layer;
removing the patterned opaque layer by using the patterned first resist layer as a mask; and
removing the patterned first resist layer.

10. A mask blank, comprise:
a transparent substrate;
an opaque layer disposed on the transparent substrate;
a cooling layer disposed on the opaque layer, wherein a thermal conductivity of the cooling layer is between 160 and 5000, and an effective atomic number of the cooling layer is between 5 and 14; and
a resist layer disposed on the cooling layer, wherein a thickness of the cooling layer is equal to a thickness of the resist layer.

11. The mask blank of claim 10, wherein the resist layer physically contacts the cooling layer.

12. The mask blank of claim 10, wherein a material of the cooling layer comprises aluminum nitride, silicon carbide, boron nitride, or graphene.

13. The mask blank of claim 10, wherein a thickness of the cooling layer ranges from about 3 nanometer (nm) to about 100 nm.

14. The mask blank of claim 10, wherein a thickness of the cooling layer is greater than or equal to a thickness of the opaque layer.

15. The mask blank of claim 10, further comprising a phase shifter over the transparent substrate, wherein the phase shifter is located between the transparent substrate and the opaque layer.

16. The mask blank of claim 15, wherein a thickness of the cooling layer is greater than or equal to a thickness of the opaque layer.

17. The mask blank of claim 10, further comprising a phase shifter over the transparent substrate and a hard mask layer, wherein the phase shifter is located between the transparent substrate and the opaque layer, and the hard mask layer is located between the opaque layer and the cooling layer.

18. The mask blank of claim 17, wherein a thickness of the cooling layer is greater than or equal to a thickness of the hard mask layer.

19. A method of manufacturing a mask blank, comprising:
providing a laminated film of a transparent substrate, an opaque layer, and a photoresist layer sequentially stacked;
removing the photoresist layer of the laminated film;
forming a cooling layer on the opaque layer, wherein a thermal conductivity of the cooling layer is between 160 and 5000, and an effective atomic number of the cooling layer is between 5 and 14; and
coating a resist layer on the cooling layer over the laminated film, wherein a thickness of the cooling layer is equal to a thickness of the resist layer.

20. The method of claim 19, wherein coating a resist layer on the cooling layer over the laminated film comprises coating the resist layer directly on the cooling layer.

* * * * *